(12) United States Patent
Saitoh et al.

(10) Patent No.: US 10,192,967 B2
(45) Date of Patent: Jan. 29, 2019

(54) SILICON CARBIDE SEMICONDUCTOR WITH TRENCH GATE

(71) Applicant: Sumitomo Electric Industries, Ltd., Osaka-shi (JP)

(72) Inventors: Yu Saitoh, Osaka (JP); Tomoaki Hatayama, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 9 days.

(21) Appl. No.: 15/306,836

(22) PCT Filed: Apr. 9, 2015

(86) PCT No.: PCT/JP2015/061070
§ 371 (c)(1),
(2) Date: Oct. 26, 2016

(87) PCT Pub. No.: WO2015/178120
PCT Pub. Date: Nov. 26, 2015

(65) Prior Publication Data
US 2017/0047415 A1  Feb. 16, 2017

(30) Foreign Application Priority Data
May 20, 2014 (JP) .................. 2014-104538

(51) Int. Cl.
*H01L 29/04* (2006.01)
*H01L 29/06* (2006.01)
(Continued)

(52) U.S. Cl.
CPC .. *H01L 29/42368* (2013.01); *H01L 21/02126* (2013.01); *H01L 21/02236* (2013.01);
(Continued)

(58) Field of Classification Search
CPC .............. H01L 29/045; H01L 29/1608; H01L 29/42368; H01L 29/66068; H01L 29/7813
See application file for complete search history.

(56) References Cited

U.S. PATENT DOCUMENTS 5,915,180 A * 6/1999 Hara .................. H01L 29/1608
257/328
6,262,439 B1 * 7/2001 Takeuchi ............ H01L 21/0485
257/331
(Continued)

FOREIGN PATENT DOCUMENTS

JP  H07-326755 A  12/1995
JP  2008-311406 A  12/2008
(Continued)

OTHER PUBLICATIONS

International Search Report in counterpart International Patent Application No. PCT/JP2015/061070, dated May 19, 2015.

*Primary Examiner* — Kevin Parendo
(74) *Attorney, Agent, or Firm* — Venable LLP; Michael A. Sartori; Laura G. Remus

(57) ABSTRACT

A silicon carbide semiconductor device includes a silicon carbide substrate, a gate oxide film, and a gate electrode. A trench is provided in the main surface to have a side surface and a bottom portion. A contact point between a first side surface portion and a second side surface portion is located in a third impurity region. An angle formed by the first side surface portion and a straight line extending through the contact point and parallel to the main surface is smaller than an angle formed by the second side surface portion and a boundary surface between a first impurity region and a second impurity region. A thickness of a portion of the gate oxide film on the contact point between the main surface and
(Continued)

the first side surface portion is larger than a thickness of a portion of the gate oxide film on the second impurity region.

6 Claims, 12 Drawing Sheets

(51) Int. Cl.
*H01L 29/10* (2006.01)
*H01L 29/12* (2006.01)
*H01L 29/16* (2006.01)
*H01L 29/423* (2006.01)
*H01L 29/66* (2006.01)
*H01L 29/78* (2006.01)
*H01L 21/02* (2006.01)
*H01L 21/04* (2006.01)
*H01L 21/3065* (2006.01)
*H01L 21/3115* (2006.01)
*H01L 21/033* (2006.01)

(52) U.S. Cl.
CPC .. *H01L 21/02255* (2013.01); *H01L 21/02332* (2013.01); *H01L 21/049* (2013.01); *H01L 21/0475* (2013.01); *H01L 21/3065* (2013.01); *H01L 21/3115* (2013.01); *H01L 29/045* (2013.01); *H01L 29/0657* (2013.01); *H01L 29/1095* (2013.01); *H01L 29/12* (2013.01); *H01L 29/1608* (2013.01); *H01L 29/4236* (2013.01); *H01L 29/42376* (2013.01); *H01L 29/66068* (2013.01); *H01L 29/78* (2013.01); *H01L 29/7813* (2013.01); *H01L 21/0337* (2013.01); *H01L 21/0485* (2013.01)

(56) References Cited

U.S. PATENT DOCUMENTS

| | | | |
|---|---|---|---|
| 8,754,422 B2* | 6/2014 | Kudou | H01L 21/0465 257/76 |
| 8,791,002 B2* | 7/2014 | Kudou | H01L 21/02164 257/333 |
| 2011/0070723 A1 | 3/2011 | Kawada et al. | |
| 2012/0161154 A1* | 6/2012 | Mimura | H01L 29/4236 257/77 |
| 2012/0248461 A1* | 10/2012 | Masuda | H01L 21/3065 257/77 |
| 2012/0326166 A1* | 12/2012 | Masuda | H01L 21/049 257/77 |
| 2013/0001679 A1* | 1/2013 | Omori | H01L 21/76897 257/330 |
| 2013/0126904 A1* | 5/2013 | Masuda | H01L 21/3065 257/77 |
| 2013/0341648 A1* | 12/2013 | Saitoh | H01L 29/1608 257/77 |
| 2015/0295079 A1 | 10/2015 | Nakano et al. | |

FOREIGN PATENT DOCUMENTS

| | | |
|---|---|---|
| JP | 2010-258294 A | 11/2010 |
| JP | 2013-110238 A | 6/2013 |
| JP | 2013-175593 A | 9/2013 |
| JP | 2013-232533 A | 11/2013 |
| JP | 2014-056882 A | 3/2014 |

\* cited by examiner

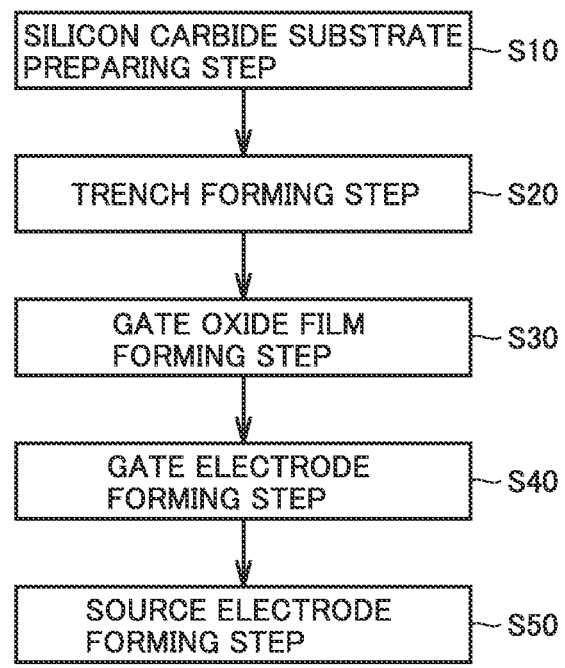
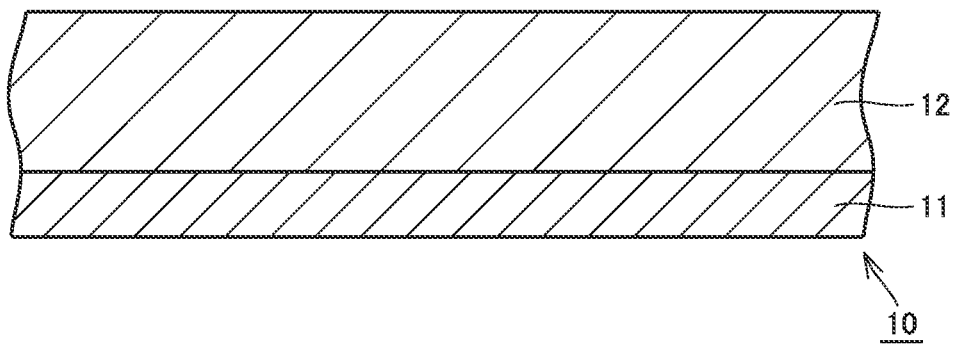

SILICON CARBIDE SEMICONDUCTOR WITH TRENCH GATE

TECHNICAL FIELD

The present invention relates to a silicon carbide semiconductor device and a method for manufacturing the silicon carbide semiconductor device, particularly, a silicon carbide semiconductor device having a gate oxide film and a method for manufacturing the silicon carbide semiconductor device.

BACKGROUND ART

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices.

Hence, by adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

Japanese Patent Laying-Open No. 2010-258294 discloses a method for manufacturing a MOSFET (Metal Oxide Semiconductor Field Effect Transistor) having a trench structure. According to the method for manufacturing the MOSFET, a corner portion constituting an opening of the trench is rounded by performing heat treatment after forming the trench. Accordingly, occurrence of gate leakage is suppressed in a gate insulating film formed on the rounded corner portion.

CITATION LIST

Patent Document

PTD 1: Japanese Patent Laying-Open No. 2010-258294

SUMMARY OF INVENTION

Technical Problem

However, according to the above-described method for manufacturing the MOSFET, the heat treatment causes migration of silicon atoms and the side surface of the trench accordingly becomes rough, whereby carrier mobility in a MOS interface is decreased to result in a high channel resistance. Moreover, a gate insulating film formed on a main surface of the substrate having step-bunching formed therein becomes thin locally, thus presumably inducing gate leakage. As a result, reliability of the MOSFET may be decreased and channel resistance may become high.

An object of one embodiment of the present invention is to provide a silicon carbide semiconductor device having high reliability and capable of maintaining a low channel resistance, and a method for manufacturing the silicon carbide semiconductor device.

Solution to Problem

A silicon carbide semiconductor device according to one embodiment of the present invention includes a silicon carbide substrate, a gate oxide film, and a gate electrode. The silicon carbide substrate has a main surface. The silicon carbide substrate includes a first impurity region, a second impurity region, and a third impurity region, the first impurity region having first conductivity type, the second impurity region being provided on the first impurity region, the second impurity region having second conductivity type different from the first conductivity type, the third impurity region being provided on the second impurity region, the third impurity region having the first conductivity type, the third impurity region constituting at least a portion of the main surface. A trench is provided in the main surface to have a side surface and a bottom portion, the side surface extending to the first impurity region through the third impurity region and the second impurity region, the bottom portion being located in the first impurity region. The side surface includes a first side surface portion and a second side surface portion, the first side surface portion being continuous to the main surface, the second side surface portion connecting the first side surface portion to the bottom portion. A contact point between the first side surface portion and the second side surface portion is located in the third impurity region. An angle formed by the first side surface portion and a straight line extending through the contact point between the first side surface portion and the second side surface portion and parallel to the main surface is smaller than an angle formed by the second side surface portion and a boundary surface between the first impurity region and the second impurity region. The gate oxide film is in contact with the third impurity region at the first side surface portion of the trench, in contact with the third impurity region and the second impurity region at the second side surface portion of the trench, and in contact with the first impurity region at the bottom portion of the trench. The gate electrode is provided on the gate oxide film. A thickness of a portion of the gate oxide film on a contact point between the main surface and the first side surface portion is larger than a thickness of a portion of the gate oxide film on the second impurity region.

A method for manufacturing a silicon carbide semiconductor device according to one embodiment of the present invention includes the following steps. A silicon carbide substrate having a main surface is prepared. The silicon carbide substrate includes a first impurity region, a second impurity region, and a third impurity region, the first impurity region having first conductivity type, the second impurity region being provided on the first impurity region, the second impurity region having second conductivity type different from the first conductivity type, the third impurity region being provided on the second impurity region, the third impurity region having the first conductivity type, the third impurity region constituting at least a portion of the main surface. A trench is formed in the main surface of the silicon carbide substrate to have a side surface and a bottom portion, the side surface extending to the first impurity region through the third impurity region and the second impurity region, the bottom portion being located in the first impurity region. The side surface includes a first side surface portion and a second side surface portion, the first side surface portion being continuous to the main surface, the second side surface portion connecting the first side surface portion to the bottom portion. A contact point between the first side surface portion and the second side surface portion is located in the third impurity region. An angle formed by the first side surface portion and a straight line extending through the contact point between the first side surface portion and the second side surface portion and parallel to the main surface is smaller than an angle formed by the second side surface portion and a boundary surface between the first impurity region and the second impurity region. A gate oxide film is formed in contact with the third impurity region at the first side surface portion of the trench, in contact with the third impurity region and the second impurity region at the second side surface portion of the trench, and in contact with the first impurity region at the bottom portion of the trench. A gate electrode is formed on the gate oxide film. A thickness of a portion of the gate oxide film on a contact point between the main surface and the first side surface portion is larger than a thickness of a portion of the gate oxide film on the second impurity region. In the step of forming the trench, the silicon carbide substrate is etched using a first gas including chlorine.

Advantageous Effects of Invention

According to one embodiment of the present invention, there can be provided a silicon carbide semiconductor device having high reliability and capable of maintaining a low channel resistance, and a method for manufacturing the silicon carbide semiconductor device.

BRIEF DESCRIPTION OF DRAWINGS

FIG. 5 is a flowchart schematically showing a method for manufacturing the silicon carbide semiconductor device in one embodiment of the present invention.

FIG. 6 is a partial cross sectional view schematically showing a first step of the method for manufacturing the silicon carbide semiconductor device in the one embodiment of the present invention.

DESCRIPTION OF EMBODIMENTS

Figure 1:
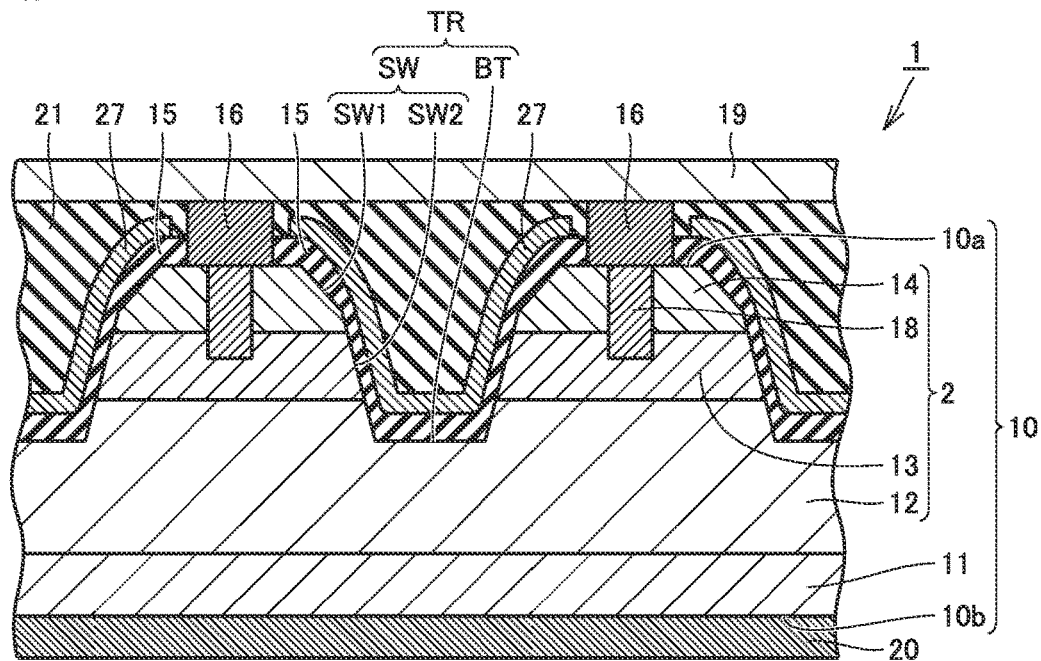
FIG. 1 is a partial cross sectional view schematically showing a configuration of a silicon carbide semiconductor device in one embodiment of the present invention.

Description of Embodiments of the Present Invention

First, embodiments of the present invention are listed and described.

(1) A silicon carbide semiconductor device according to one embodiment of the present invention includes a silicon carbide substrate 10, a gate oxide film 15, and a gate electrode 27. Silicon carbide substrate 10 has a main surface 10a. Silicon carbide substrate 10 includes a first impurity region 12, a second impurity region 13, and a third impurity region 14, first impurity region 12 having first conductivity type, second impurity region 13 being provided on first impurity region 12, second impurity region 13 having second conductivity type different from the first conductivity type, third impurity region 14 being provided on second impurity region 13, third impurity region 14 having the first conductivity type, third impurity region 14 constituting at least a portion of main surface 10a. A trench TR is provided in main surface 10a to have a side surface SW and a bottom portion BT, side surface SW extending to first impurity region 12 through third impurity region 14 and second impurity region 13, bottom portion BT being located in first impurity region 12. Side surface SW includes a first side surface portion SW1 and a second side surface portion SW2, first side surface portion SW1 being continuous to main surface 10a, second side surface portion SW2 connecting first side surface portion SW1 to bottom portion BT. A contact point C2 between first side surface portion SW1 and second side surface portion SW2 is located in third impurity region 14. An angle θ1 formed by first side surface portion SW1 and a straight line extending through contact point C2 between first side surface portion SW1 and second side surface portion SW2 and parallel to main surface 10a is smaller than an angle θ2 formed by second side surface portion SW2 and a boundary surface 13a between first impurity region 12 and second impurity region 13. Gate oxide film 15 is in contact with third impurity region 14 at first side surface portion SW1 of trench TR, in contact with third impurity region 14 and second impurity region 13 at second side surface portion SW2 of trench TR, and in contact with first impurity region 12 at bottom portion BT of trench TR. Gate electrode 27 is provided on gate oxide film 15. A thickness of a portion of gate oxide film 15 on a contact point C1 between main surface 10a and first side surface portion SW1 is larger than a thickness of a portion of gate oxide film 15 on second impurity region 13.

In accordance with silicon carbide semiconductor device 1 according to (1), the thickness of the portion of gate oxide film 15 on contact point C1 between main surface 10a and first side surface portion SW1 is larger than the thickness of the portion of gate oxide film 15 on second impurity region 13. Hence, leakage current can be suppressed at the portion of gate oxide film 15 on contact point C1 between main surface 10a and side surface SW while maintaining a low resistance of the channel portion of second impurity region 13. As a result, a silicon carbide semiconductor device can be obtained which has high reliability and is capable of maintaining a low channel resistance.

(2) Preferably in the silicon carbide semiconductor device according to (1), angle θ2 formed by second side surface portion SW2 and boundary surface 13a between first impurity region 12 and second impurity region 13 is not less than 50° and not more than 65°. Accordingly, channel resistance in second impurity region 13 can be effectively reduced.

(3) Preferably in the silicon carbide semiconductor device according to (1) or (2), angle θ1 formed by first side surface portion SW1 and the straight line extending through contact point C2 between first side surface portion SW1 and second side surface portion SW2 and parallel to main surface 10a is not less than 20° and less than 50°. By setting angle θ1 at not less than 20°, the width of trench TR is increased, thereby suppressing the cell density from being decreased. By setting angle θ1 at less than 50°, the thickness of gate oxide film 15 on contact point C1 between main surface 10a and first side surface portion SW1 can be increased effectively.

(4) Preferably in the silicon carbide semiconductor device according to any one of (1) to (3), the thickness of the portion of gate oxide film 15 on bottom portion BT of trench TR is larger than the thickness of the portion of gate oxide film 15 on second impurity region 13. Accordingly, leakage current can be suppressed from being generated in gate oxide film 15 on bottom portion BT of trench TR.

(5) Preferably in the silicon carbide semiconductor device according to any one of (1) to (4), second side surface portion SW2 of trench TR includes a first plane S1 having a plane orientation of {0-33-8}. Accordingly, channel resistance in side surface SW can be reduced. Accordingly, on resistance of the silicon carbide semiconductor device can be reduced.

(6) Preferably in the silicon carbide semiconductor device according to (5), second side surface portion SW2 of trench TR microscopically includes first plane S1, and second side surface portion SW2 microscopically further includes a second plane S2 having a plane orientation of {0-11-1}. Accordingly, channel resistance in side surface SW can be further reduced. Accordingly, on resistance of the silicon carbide semiconductor device can be reduced.

(7) Preferably in the silicon carbide semiconductor device according to (6), first plane S1 and second plane S2 of second side surface portion SW2 of trench TR include a combined plane having a plane orientation of {0-11-2}. Accordingly, channel resistance in side surface SW can be further reduced. Accordingly, on resistance of the silicon carbide semiconductor device can be reduced.

(8) Preferably in the silicon carbide semiconductor device according to (7), second side surface portion SW2 of trench TR macroscopically has an off angle of 62°±10° relative to a {000-1} plane. Accordingly, channel resistance in side surface SW can be further reduced. Accordingly, on resistance of the silicon carbide semiconductor device can be reduced.

(9) A method for manufacturing a silicon carbide semiconductor device according to one embodiment of the present invention includes the following steps. A silicon carbide substrate 10 having a main surface 10a is prepared. Silicon carbide substrate 10 includes a first impurity region 12, a second impurity region 13, and a third impurity region 14, first impurity region 12 having first conductivity type, second impurity region 13 being provided on first impurity region 12, second impurity region 13 having second conductivity type different from the first conductivity type, third impurity region 14 being provided on second impurity region 13, third impurity region 14 having the first conductivity type, third impurity region 14 constituting at least a portion of main surface 10a. A trench TR is formed in main surface 10a of silicon carbide substrate 10 to have a side surface SW and a bottom portion BT, side surface SW extending to first impurity region 12 through third impurity region 14 and second impurity region 13, bottom portion BT being located in the first impurity region. Side surface SW includes a first side surface portion SW1 and a second side surface portion SW2, first side surface portion SW1 being continuous to main surface 10a, second side surface portion SW2 connecting first side surface portion SW1 to bottom portion BT. A contact point C1 between first side surface portion SW1 and second side surface portion SW2 is located in third impurity region 14. An angle θ1 formed by first side surface portion SW1 and a straight line extending through contact point C1 between first side surface portion SW1 and second side surface portion SW2 and parallel to main surface 10a is smaller than an angle θ2 formed by second side surface portion SW2 and a boundary surface 13a between first impurity region 12 and second impurity region 13. A gate oxide film 15 is formed in contact with third impurity region 14 at first side surface portion SW1 of trench TR, in contact with third impurity region 14 and second impurity region 13 at second side surface portion SW2 of trench TR, and in contact with first impurity region 12 at bottom portion BT of trench TR. A gate electrode 27 is formed on gate oxide film 15. A thickness of a portion of gate oxide film 15 on a contact point C1 between main surface 10a and first side surface portion SW1 is larger than a thickness of a portion of gate oxide film 15 on second impurity region 13. In the step of forming the trench, silicon carbide substrate 10 is etched using a first gas including chlorine.

In accordance with the method for manufacturing silicon carbide semiconductor device 1 according to (9), the thickness of the portion of gate oxide film 15 on contact point C1 between main surface 10a and first side surface portion SW1 is larger than the thickness of the portion of gate oxide film 15 on second impurity region 13. Hence, leakage current can be suppressed at the portion of gate oxide film 15 on contact point C1 between main surface 10a and side surface SW while maintaining a low resistance of the channel portion of second impurity region 13. As a result, a silicon carbide semiconductor device can be obtained which has high reliability and is capable of maintaining a low channel resistance.

(10) Preferably in the method for manufacturing the silicon carbide semiconductor device according to (9), the step of forming gate oxide film 15 includes a step of oxidizing silicon carbide substrate 10 at not more than 1300° C. Accordingly, plane orientation dependency of the oxidation rate of the silicon carbide can be increased. Hence, the thickness of the portion of gate oxide film 15 on contact point C1 between main surface 10a and first side surface portion SW1 can be significantly larger than the thickness of the portion of gate oxide film 15 on side surface SW of trench TR (particularly, second impurity region 13). As a result, a silicon carbide semiconductor device can be obtained which has higher reliability and is capable of maintaining a low channel resistance.

(11) Preferably in the method for manufacturing the silicon carbide semiconductor device according to (9) or (10), the first gas includes at least one selected from a group consisting of chlorine and an interhalogen compound. Accordingly, silicon carbide can be etched effectively.

(12) Preferably in the method for manufacturing the silicon carbide semiconductor device according to any one of (9) to (11), the step of etching silicon carbide substrate 10 includes: a first step of etching silicon carbide substrate 10 using the first gas and a second gas including at least one of oxygen, fluorine, and hydrogen; and a second step of etching silicon carbide substrate 10 using the first gas and the second gas after decreasing a flow rate of the second gas as compared with a flow rate of the second gas in the first step. Accordingly, the shape of trench TR can be controlled with high precision.

(13) Preferably in the method for manufacturing the silicon carbide semiconductor device according to (12), in the second step, silicon carbide substrate 10 is etched using the first gas after stopping introduction of the second gas. Accordingly, the shape of trench TR can be controlled with higher precision.

(14) Preferably in the method for manufacturing the silicon carbide semiconductor device according to (12) or (13), the second gas includes at least one selected from a group consisting of oxygen, fluorine, hydrogen, sulfur hexafluoride, carbon tetrafluoride, hydrogen chloride, chlorine monoxide, chlorine dioxide, dichlorine monoxide and dichlorine heptoxide. Accordingly, silicon carbide can be etched more effectively.

(15) Preferably in the method for manufacturing the silicon carbide semiconductor device according to any one of (9) to (14), the step of forming trench TR includes a step of etching silicon carbide substrate 10 at not less than 700° C. and not more than 1000° C. By etching silicon carbide substrate 10 at not less than 700° C., silicon carbide can be etched effectively. By etching silicon carbide substrate 10 at not more than 1000° C., the etching rate of silicon carbide can be suppressed from being too high, thereby controlling the shape of trench TR with high precision.

(16) Preferably in the method for manufacturing the silicon carbide semiconductor device according to any one of (9) to (15), after the step of forming gate oxide film 15, angle θ2 formed by second side surface portion SW2 and boundary surface 13a between first impurity region 12 and second impurity region 13 is not less than 50° and not more than 65°. Accordingly, channel resistance in second impurity region 13 can be effectively reduced.

(17) Preferably in the method for manufacturing the silicon carbide semiconductor device according to any one of (9) to (16), after the step of forming gate oxide film 15, angle θ1 formed by first side surface portion SW1 and the straight line extending through contact point C2 between first side surface portion SW1 and second side surface portion SW2 and parallel to main surface 10a is not less than 20° and less than 50°. By setting angle θ1 at not less than 20°, the width of trench TR is increased, thereby suppressing the cell density from being decreased. By setting angle θ1 at less than 50°, the thickness of gate oxide film 15 on contact point C1 between main surface 10a and first side surface portion SW1 can be increased effectively.

(18) Preferably in the method for manufacturing the silicon carbide semiconductor device according to any one of (9) to (17), after the step of forming gate oxide film 15, a thickness of a portion of gate oxide film 15 on bottom portion BT of trench TR is larger than a thickness of a portion of gate oxide film 15 on second impurity region 13. Accordingly, occurrence of leakage current can be suppressed in gate oxide film 15 on bottom portion BT of trench TR.

Details of Embodiments of the Present Invention

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First, the following describes a configuration of a MOSFET serving as a silicon carbide semiconductor device according to one embodiment of the present invention.

With reference to FIG. 1, MOSFET 1 of the present embodiment mainly includes a silicon carbide substrate 10, gate oxide films 15, gate electrodes 27, an interlayer insulating film 21, source electrodes 16, a source interconnection layer 19, and a drain electrode 20. Silicon carbide substrate 10 has a first main surface 10a and a second main surface 10b opposite to first main surface 10a. Silicon carbide substrate 10 mainly includes: a silicon carbide single crystal substrate 11 constituting second main surface 10b; and a silicon carbide epitaxial layer 2 provided on silicon carbide single crystal substrate 11 and constituting first main surface 10a. The silicon carbide single crystal is composed of, for example, a hexagonal silicon carbide single crystal and preferably has polytype 4H. Silicon carbide single crystal substrate 11 has an impurity such as nitrogen, and has n type (first conductivity type) conductivity. First main surface 10a of silicon carbide substrate 10 is, for example, a {000-1} plane or a plane angled off by about not more than 8° relative to the {000-1} plane, and is preferably a (000-1) plane or a plane angled off by about not more than 8° relative to the (000-1) plane.

Silicon carbide substrate 10 mainly has a drift region 12 (first impurity region), base regions 13 (second impurity region), source regions 14 (third impurity region), and contact regions 18. Drift region 12 is provided on silicon carbide single crystal substrate 11. Drift region 12 includes an impurity such as nitrogen, and has n type conductivity, for example. Drift region 12 preferably has an impurity concentration lower than that of silicon carbide single crystal substrate 11. The concentration of the impurity such as nitrogen in drift region 12 is not less than $1\times10^{15}$ cm$^{-3}$ and not more than $5\times10^{16}$ cm$^{-3}$, for example.

Each of base regions 13 includes an impurity such as aluminum, and has p type conductivity (second conductivity type different from the first conductivity type), for example. Base region 13 is provided on drift region 12. The concentration of the impurity such as aluminum in base region 13 is higher than the concentration of the impurity such as nitrogen in drift region 12.

Each of source regions 14 includes an impurity such as nitrogen or phosphorus, and has n type conductivity, for example. Source regions 14 are provided on base regions 13 to be separated from drift region 12 by base regions 13. The concentration of the impurity such as phosphorus in each of source regions 14 is not less than $5\times10^{18}$ cm$^{-3}$ and not more than $3\times10^{20}$ cm$^{-3}$, for example. Each of contact regions 18 includes an impurity such as aluminum, and has p type conductivity, for example. Contact region 18 extends to base region 13 through source region 14. The impurity concentration of contact region 18 is higher than the impurity concentration of base region 13. Each of source region 14 and the contact region constitutes a portion of first main surface 10a of silicon carbide substrate 10.

First main surface 10a of silicon carbide substrate 10 is provided with a trench TR having (i) side surfaces SW extending to drift region 12 through source region 14 and base region 13 and (ii) a bottom portion BT located in drift region 12. On base region 13, each of side surfaces SW includes a channel surface of MOSFET 1. Side surface SW is inclined relative to first main surface 10a of silicon carbide substrate 10. In a cross section (field of view seen from a direction parallel to first main surface 10a), the width of trench TR is increased toward the opening in a tapered manner. Preferably, each side surface SW has a predetermined crystal plane (also referred to as "special plane") particularly at its portion on base region 13. Details of the special plane will be described later.

Figure 2:
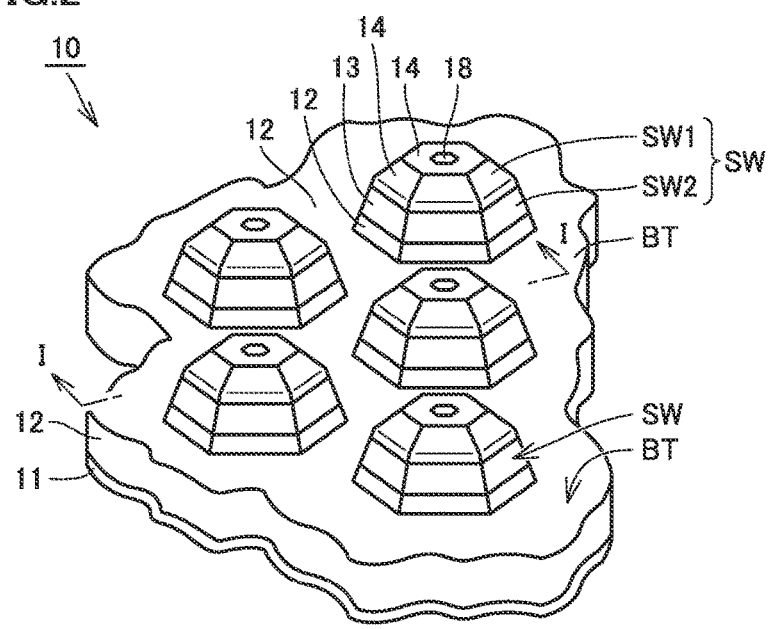
FIG. 2 is a partial perspective view schematically showing a configuration of a main surface of the silicon carbide substrate included in the silicon carbide semiconductor device of FIG. 1.
Figure 3:
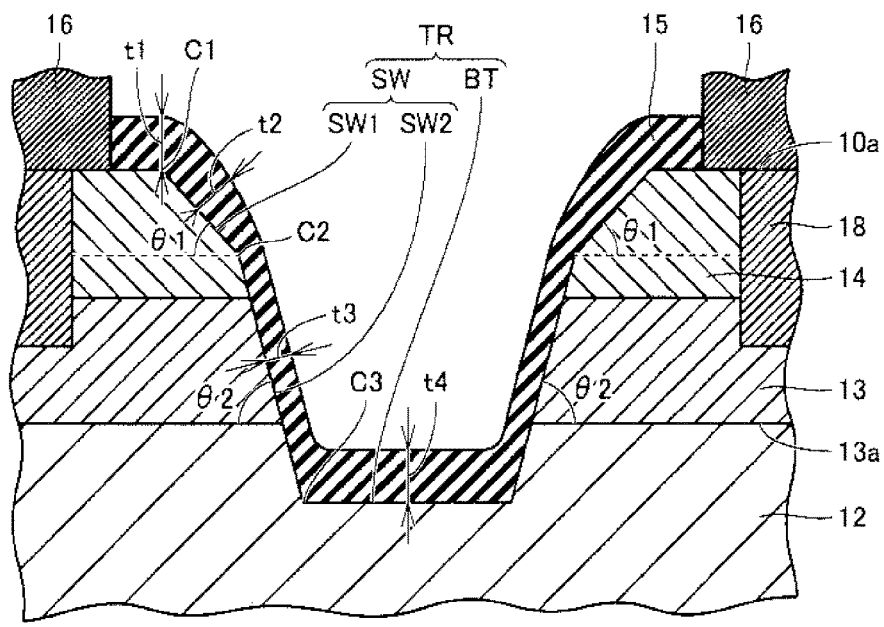
FIG. 3 is a partial cross sectional view schematically showing configurations of a trench and a gate oxide film provided in and on the silicon carbide substrate included in the silicon carbide semiconductor device of FIG. 1.

With reference to FIG. 2 and FIG. 3, details of the shape of trench TR will be described. FIG. 2 shows only silicon carbide substrate 10. FIG. 3 shows silicon carbide substrate 10 and gate oxide film 15, and each of gate electrode 27 and interlayer insulating film 21 is not illustrated.

Side surface SW of trench TR includes: a first side surface portion SW1 continuous to first main surface 10a and constituted of source region 14; and a second side surface portion SW2 connecting first side surface portion SW1 to bottom portion BT. Bottom portion BT of trench TR is a surface substantially parallel to first main surface 10a of silicon carbide substrate 10. Second side surface portion SW2 is constituted of source region 14, base region 13, and drift region 12. In a plan view (field of view seen from a direction perpendicular to first main surface 10a), bottom portion BT of trench TR extends in the form of a honeycomb. In a plan view, contact region 18 is provided to be surrounded by each of source region 14 and base region 13. In the plan view, the outer edge of base region 13, source region 14, and contact region 18 has a hexagonal shape, for example.

With reference to FIG. 3, a contact point C2 between first side surface portion SW1 and second side surface portion SW2 is located in source region 14. In other words, contact point C2 between first side surface portion SW1 and second side surface portion SW2 is located between base region 13 and first main surface 10a. A first angle θ1 formed by first side surface portion SW1 and a straight line extending through contact point C2 between first side surface portion SW1 and second side surface portion SW2 and parallel to first main surface 10a of silicon carbide substrate 10 is smaller than a second angle θ2 formed by second side surface portion SW2 and a boundary surface 13a between drift region 12 and base region 13. Preferably, second angle θ2 formed by second side surface portion SW2 and boundary surface 13a between drift region 12 and base region 13 is not less than 50° and not more than 65°. Preferably, first angle θ1 formed by first side surface portion SW1 and the straight line extending through contact point C2 between first side surface portion SW1 and second side surface portion SW2 and parallel to first main surface 10a of silicon carbide substrate 10 is not less than 20° and less than 50°.

Gate oxide film 15 is in contact with drift region 12, base region 13, and source region 14 at side surface SW of the trench, and is in contact with drift region 12 at bottom portion BT of trench TR. Gate oxide film 15 may extend from side surface SW of trench TR onto first main surface 10a of silicon carbide substrate 10. In other words, gate oxide film 15 may be in contact with a portion of first main surface 10a and may be in contact with source electrode 16 on first main surface 10a. Gate oxide film 15 includes silicon dioxide, for example.

A thickness t1 of a portion of gate oxide film 15 on a contact point C1 between first main surface 10a of silicon carbide substrate 10 and side surface SW of trench TR is larger than a thickness t3 of a portion of gate oxide film 15 on base region 13. Thickness t1 of the portion of gate oxide film 15 on contact point C1 between first main surface 10a of silicon carbide substrate 10 and side surface SW of trench TR refers to a thickness of gate oxide film 15 in a direction perpendicular to first main surface 10a. Moreover, a thickness t3 of a portion of gate oxide film 15 on base region 13 refers to a thickness of a portion of gate oxide film 15 in a direction perpendicular to the portion of second side surface portion SW2 constituted of base region 13. Preferably, a thickness t4 of a portion of gate oxide film 15 on bottom portion BT of trench TR is larger than thickness t3 of the portion of gate oxide film 15 on base region 13. Thickness t4 of the portion of gate oxide film 15 on bottom portion BT of trench TR refers to a thickness t4 of a portion of gate oxide film 15 in a direction perpendicular to bottom portion BT of trench TR. Preferably, a thickness t2 of a portion of gate oxide film 15 on source region 14 is smaller than the thickness of the portion of gate oxide film 15 on contact point C1 between first main surface 10a and first side surface portion SW1, and is larger than thickness t3 of the portion of gate oxide film 15 on base region 13. The thickness of the portion of gate oxide film 15 on source region 14 refers to a thickness t2 of a portion of gate oxide film 15 in a direction perpendicular to first side surface portion SW1. A distance between contact point C1 and contact point C2 along a direction parallel to first main surface 10a is not less than 0.01 μm and not more than 0.1 μm. Thickness t1 of the portion of gate oxide film 15 on contact point C1 between first main surface 10a and side surface SW of trench TR is not less than 70 nm and not more than 100 nm, for example. Thickness t3 of the portion of gate oxide film 15 on base region 13 is not less than 40 nm and not more than 60 nm, for example.

Figure 4:
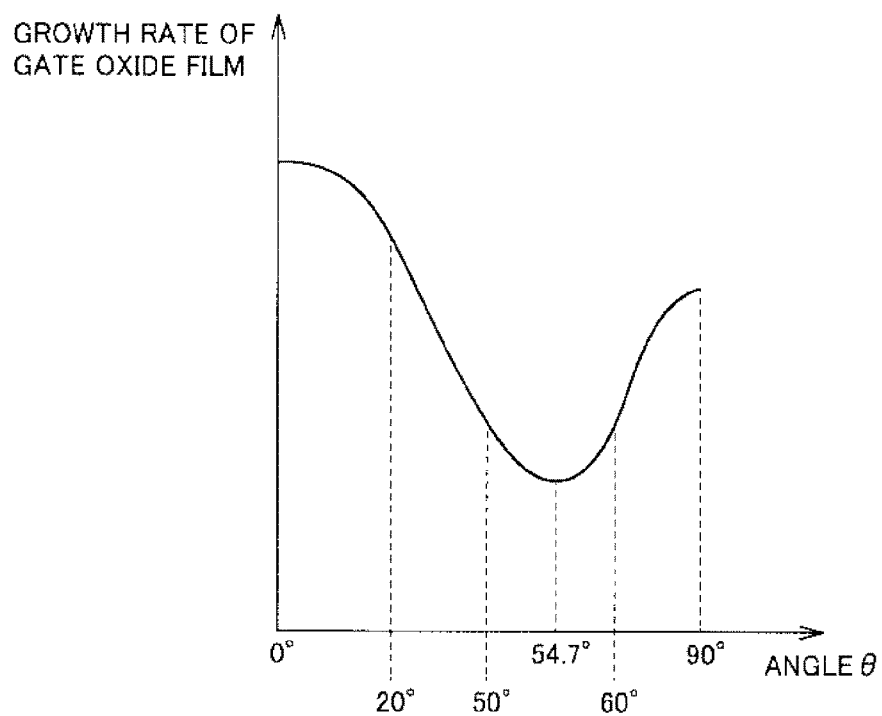
FIG. 4 shows a relation between a growth rate of the gate oxide film and an angle of the side surface of the trench.

With reference to FIG. 4, the following describes: an angle θ formed by first main surface 10a of silicon carbide substrate 10 and the surface (i.e., side surface SW of trench TR) on which gate oxide film 15 is formed; and a rate of thermal oxidation of the surface on which gate oxide film 15 is formed (i.e., growth rate of the gate oxide film). It should be noted that in FIG. 4, in the case of an angle of 0°, the surface on which the gate oxide film is formed corresponds to the (000-1) plane.

As shown in FIG. 4, the growth rate of gate oxide film 15 to be formed on side surface SW when angle θ of side surface SW of trench TR is not less than 50° and not more than 65° is smaller than the growth rate of gate oxide film 15 to be formed on side surface SW when angle θ of side surface SW of trench TR is not less than 20° and less than 50°. First main surface 10a or bottom portion BT of trench TR corresponds to a case where angle θ of trench TR is 0°. Hence, the growth rate of gate oxide film 15 to be formed on first main surface 10a or bottom portion BT of trench TR becomes larger than the growth rate of gate oxide film 15 to be formed on side surface SW when angle θ of side surface SW of trench TR is not less than 20° and less than 50°. As a result, the thickness of gate oxide film 15 formed on side surface SW when angle θ of side surface SW of trench TR is not less than 20° and less than 50° is larger than the thickness of gate oxide film 15 formed on side surface SW and is smaller than the thickness of gate oxide film 15 formed on first main surface 10a or bottom portion BT of trench TR when angle θ of side surface SW of trench TR is not less than 50° and not more than 65°.

With reference to FIG. 1 again, gate electrode 27 is provided on gate oxide film 15 in trench TR. Gate electrode 27 is in contact with each of source region 14, base region 13, and drift region 12 with gate oxide film 15 being interposed therebetween. Gate electrode 27 is composed of a conductive material such as polysilicon including an impurity, for example.

Source electrode 16 is in contact with source region 14 and contact region 18 at first main surface 10a of silicon carbide substrate 10, for example. Source electrode 16 includes TiAlSi, for example. Source interconnection layer 19 is in contact with source electrode 16. Source interconnection layer 19 includes aluminum, for example. Interlayer insulating film 21 is in contact with gate electrode 27 in trench TR. Interlayer insulating film 21 insulates between gate electrode 27 and source interconnection layer 19. In second main surface 10b, drain electrode 20 is in ohmic junction with silicon carbide single crystal substrate 11. Drain electrode 20 is composed of a material including NiSi, for example.

Next, the following describes a method for manufacturing MOSFET 1 serving as the silicon carbide semiconductor device according to one embodiment of the present invention.

First, a silicon carbide substrate preparing step (S10: FIG. 5) is performed. With reference to FIG. 6, silicon carbide single crystal substrate 11 having an upper surface and a lower surface is prepared. The upper surface preferably has an off angle of not more than 8° relative to the {000-1} plane, more preferably, has an off angle of not more than 4° relative to the {000-1} plane. In this case, the {000-1} plane is more preferably the (000-1) plane. Silicon carbide single crystal substrate 11 is composed of a hexagonal silicon carbide single crystal having polytype 4H, for example.

Next, drift region 12 is formed by epitaxial growth on the upper surface of silicon carbide single crystal substrate 11. The epitaxial growth can be performed by means of CVD (Chemical Vapor Deposition). As the source material gas, a mixed gas of silane ($SiH_4$) and propane ($C_3H$) can be used, for example. In the epitaxial growth, it is preferable to introduce nitrogen (N) or phosphorus (P) as an impurity, for example.

Figure 7:
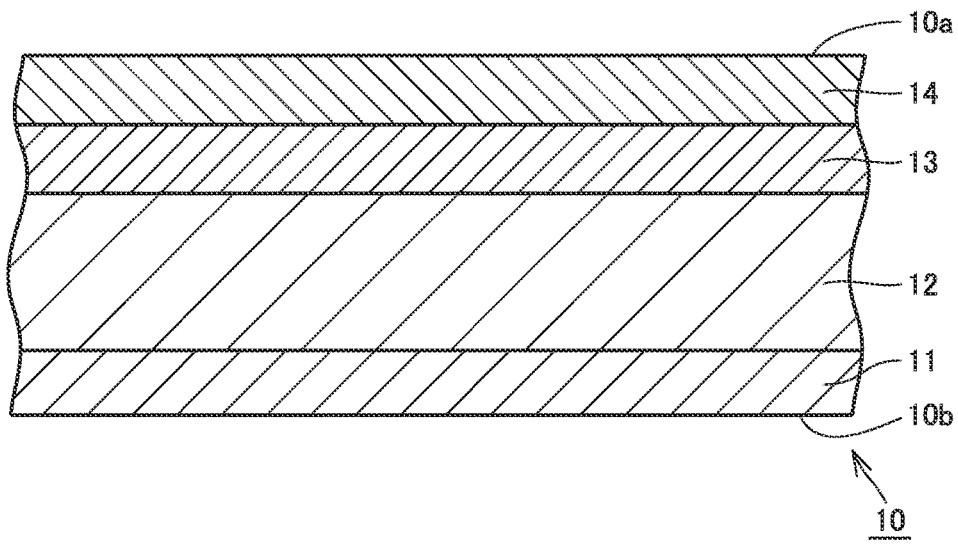
FIG. 7 is a partial cross sectional view schematically showing a second step of the method for manufacturing the silicon carbide semiconductor device in the one embodiment of the present invention.

Next, base region 13 and source region 14 are formed on drift region 12. With reference to FIG. 7, for example, base region 13 is formed in contact with drift region 12 through ion implantation of an impurity such as aluminum into the entire surface of drift region 12. Next, for example, source region 14 is formed in contact with base region 13 through ion implantation of an impurity such as nitrogen or phosphorus into the entire surface of base region 13. Source region 14 constitutes first main surface 10a of silicon carbide substrate 10. It should be noted that instead of the ion implantation, epitaxial growth involving addition of an impurity may be employed to form base region 13 and source region 14.

Figure 8:
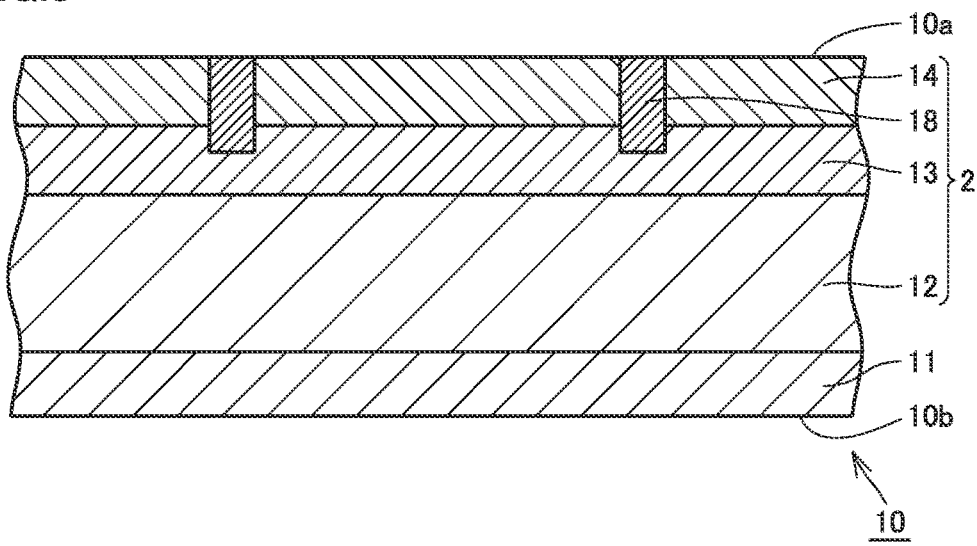
FIG. 8 is a partial cross sectional view schematically showing a third step of the method for manufacturing the silicon carbide semiconductor device in the one embodiment of the present invention.

Next, contact regions 18 are formed. With reference to FIG. 8, by ion implantation of a p type impurity such as aluminum into portions of the surface of source region 14, contact regions 18 are formed in contact with base region 13 to extend through source region 14, for example.

Next, activation annealing is performed to activate the impurities provided in silicon carbide substrate 10 by the ion implantation. This activation annealing is preferably performed at a temperature of not less than 1500° C. and not more than 1900° C., for example, a temperature of approximately 1700° C. The activation annealing is performed for approximately 30 minutes, for example. The atmosphere of the activation annealing is preferably an inert gas atmosphere, such as an Ar atmosphere. In this way, silicon carbide substrate 10 is prepared which includes: drift region 12 having n type conductivity; base region 13 provided on drift region 12 and having p type conductivity; source region 14 provided on base region 13 and having n type conductivity; and the contact regions extending through source region 14 to be in contact with base region 13 and having p type conductivity.

Figure 9:
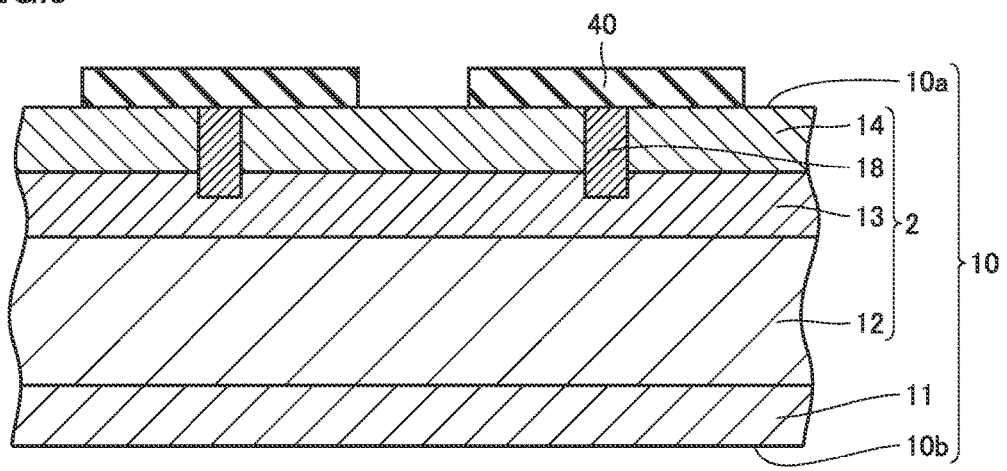
FIG. 9 is a partial cross sectional view schematically showing a fourth step of the method for manufacturing the silicon carbide semiconductor device in the one embodiment of the present invention.

Next, a trench forming step (S20: FIG. 5) is performed. For example, an etching mask 40 having an opening is formed on first main surface 10a of silicon carbide substrate 10. The opening is formed in conformity with the position of trench TR (FIG. 1). With reference to FIG. 9, etching mask 40 is formed on first main surface 10a in contact with contact regions 18 and source region 14. Etching mask 40 can be formed by patterning a silicon oxide film after forming the silicon oxide film by thermally oxidizing first main surface 10a of silicon carbide substrate 10, for example.

Figure 10:
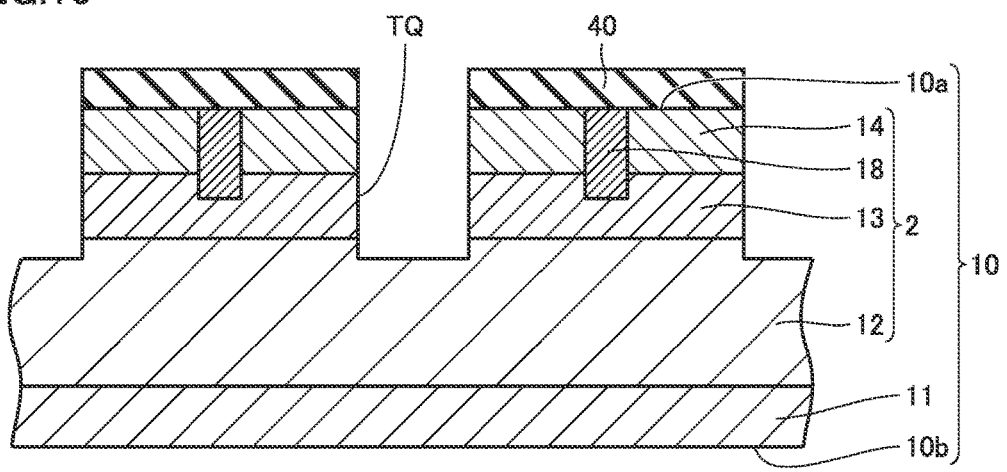
FIG. 10 is a partial cross sectional view schematically showing a fifth step of the method for manufacturing the silicon carbide semiconductor device in the one embodiment of the present invention.

Next, etching having a physical effect is performed onto first main surface 10a of silicon carbide substrate 10 on which etching mask 40 is provided. Accordingly, source region 14, base region 13, and a portion of drift region 12 are removed by etching in the opening of etching mask 40, thereby forming a recess TQ in first main surface 10a (see FIG. 10). Recess TQ has side wall surfaces substantially perpendicular to first main surface 10a. As the etching having the physical effect, reactive ion etching (RIE) is preferable and inductively coupled plasma (ICP) RIE is more preferable. As a reactive gas in the RIE, $SF_6$ or a mixed gas of $SF_6$ and $O_2$ can be used.

Next, thermal etching is performed onto first main surface 10a of silicon carbide substrate 10 on which etching mask 40 is provided and in which recess TQ is formed. For example, first main surface 10a of silicon carbide substrate 10 is etched using a first gas at least including chlorine. The first gas including chlorine is chlorine, an interhalogen compound, and the like, for example. Examples of the interhalogen compound include $ClF_x$, $BrF_x$, $IF_x$, and the like, where X is an odd number such as 1 or 3. The first gas may include a carrier gas in addition to chlorine. An exemplary, usable carrier gas is nitrogen gas, argon gas, helium gas, or the like. For example, first, first main surface 10a of silicon carbide substrate 10 is etched (first etching step) using the first gas and a second gas including at least one of oxygen, fluorine, and hydrogen. Examples of the second gas including at least one of oxygen, fluorine, and hydrogen includes oxygen, fluorine, hydrogen, $SF_6$ (sulfur hexafluoride), $CF_4$ (carbon tetrafluoride) and HCl (hydrogen chloride), $ClO^-$ (chlorine monoxide), $ClO_2$ (chlorine dioxide), $Cl_2O$ (dichlorine monoxide), $Cl_2O_7$ (dichlorine heptoxide), and the like. Specifically, a mixed gas of chlorine gas and oxygen gas is employed to thermally etch first main surface 10a of silicon carbide substrate 10 at 800° C., for example. Oxygen has a volume concentration of about not less than 10% and not more than 20%, for example. In the mixed gas, as the concentration of the chlorine gas is higher, silicon carbide is more likely to be etched. Specifically, silicon carbide reacts with chlorine to form into silicon tetrachloride and carbon. That is, silicon is formed into silicon tetrachloride and is removed as a gas, with the result that carbon remains at side surfaces SW and bottom portion BT of trench TR. Carbon reacts with oxygen to form into carbon dioxide and is removed as a gas. By removing silicon and carbon from first main surface 10a of silicon carbide substrate 10 in this way, trench TR is formed in first main surface 10a.

Next, the flow rate of the second gas is reduced. Specifically, the flow rate of the oxygen gas is reduced to increase the concentration of the chlorine gas. After reducing the flow rate of the second gas, the first gas and the second gas are employed to etch first main surface 10a of silicon carbide substrate 10 (second etching step). Preferably, in the second etching step, introduction of the second gas may be stopped. After the introduction of the second gas is stopped, the first gas is used to etch first main surface 10a of silicon carbide substrate 10. Specifically, after etching first main surface 10a of silicon carbide substrate 10 using the chlorine gas and the oxygen gas (first etching step), the introduction of the oxygen gas is stopped. After stopping the introduction of the oxygen gas, first main surface 10a of silicon carbide substrate 10 is etched using the chlorine gas (second etching step). After the thermal etching step, etching mask 40 is removed.

In each of the first etching step and the second etching step, first main surface 10a of silicon carbide substrate 10 is thermally etched at, for example, not less than 700° C. and not more than 1000° C., preferably, first main surface 10a of silicon carbide substrate 10 is thermally etched at not less than 800° C. and not more than 900° C. The temperature of silicon carbide substrate 10 in the second etching step may be lower than the temperature of silicon carbide substrate 10 in the first etching step. By reducing the temperature of silicon carbide substrate 10, the etching rate of silicon carbide becomes low, so that the shape of trench TR formed in first main surface 10a of silicon carbide substrate 10 can be controlled with high precision.

Figure 11:
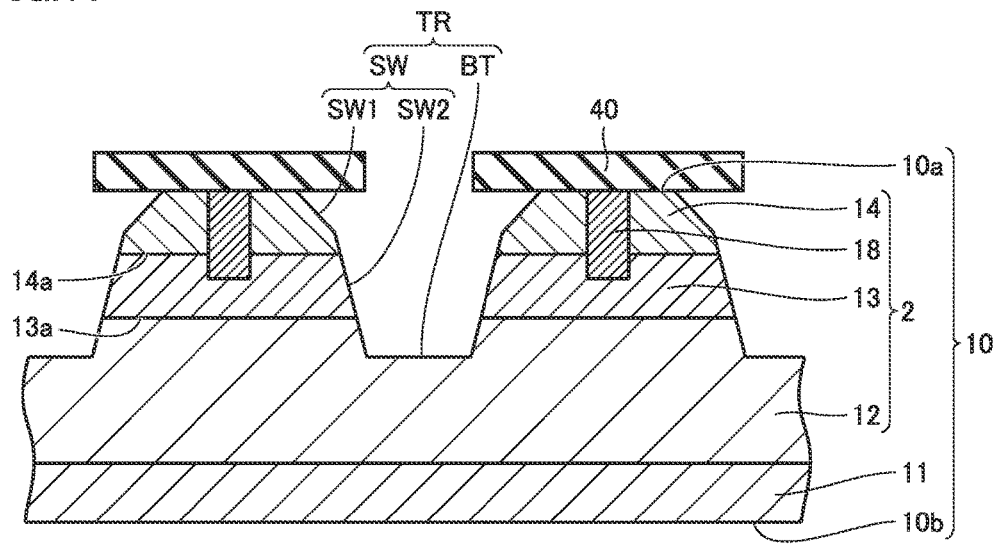
FIG. 11 is a partial cross sectional view schematically showing a sixth step of the method for manufacturing the silicon carbide semiconductor device in the one embodiment of the present invention.

In this way, in first main surface 10a of silicon carbide substrate 10, trench TR is formed to have (i) side surfaces SW extending to drift region 12 through source region 14 and base region 13 and (ii) bottom portion BT located in drift region 12. With reference to FIG. 11, each of side surfaces SW of trench TR has (i) first side surface portion SW1 that is continuous to first main surface 10a and that is formed in source region 14, and (ii) second side surface portion SW2 that is continuous to first side surface portion SW1 and that is constituted of source region 14, base region 13, and drift region 12. Preferably, during the formation of trench TR, the special plane is spontaneously formed on side surface SW, in particular, on base region 13. Details of the special plane will be described later.

Figure 12:
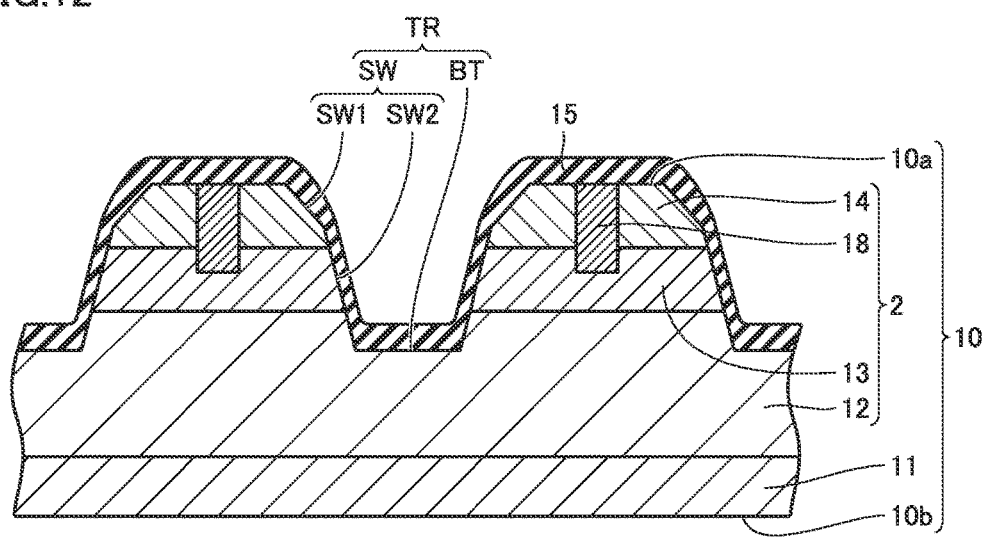
FIG. 12 is a partial cross sectional view schematically showing a seventh step of the method for manufacturing the silicon carbide semiconductor device in the one embodiment of the present invention.

Next, a gate oxide film forming step (S30: FIG. 5) is performed. With reference to FIG. 12, gate oxide film 15 is formed to cover first main surface 10a of silicon carbide substrate 10, side surface SW of trench TR, and bottom portion BT of trench TR. More specifically, gate oxide film 15 is formed in contact with drift region 12, base region 13, and source region 14 at side surface SW of trench TR, and in contact with drift region 12 at bottom portion BT of trench TR. Gate oxide film 15 is formed by thermal oxidation, for example.

Preferably, by oxidizing silicon carbide substrate 10 at not more than 1300° C., gate oxide film 15 is formed in contact with each of side surfaces SW and bottom portion BT of trench TR. More preferably, gate oxide film 15 is formed by oxidizing silicon carbide substrate 10 at not more than 1250° C., and further preferably, gate oxide film 15 is formed by oxidizing silicon carbide substrate 10 at not more than 1100° C. By forming gate oxide film 15 by thermally oxidizing silicon carbide substrate 10 provided with trench TR at a temperature of not more than 1300° C., plane orientation dependency of the oxidation rate of silicon carbide can be increased. As shown in FIG. 4, the oxidation rate of silicon carbide differs depending on the plane orientation of silicon carbide. Specifically, the growth rate of gate oxide film 15 formed on first main surface 10a of silicon carbide substrate 10 is larger than the growth rate of gate oxide film 15 on side surface SW of trench TR (particularly, the channel region). The plane orientation dependency of the oxidation rate of silicon carbide becomes significantly large at not more than 1300° C., and become smaller at more than 1300° C. In other words, by forming gate oxide film 15 by thermally oxidizing silicon carbide substrate 10 provided with trench TR at a temperature of not more than 1300° C., the thickness of the portion of gate oxide film 15 on first main surface 10a of silicon carbide substrate 10 can be significantly larger than the thickness of the portion of gate oxide film 15 on side surface SW of trench TR (particularly, the channel region). It should be noted that after forming gate oxide film 15 in contact with each of side surfaces SW and bottom portion BT of trench TR at not more than 1300° C., the film quality of gate oxide film 15 may be improved by heating gate oxide film 15 at a temperature higher than 1300° C. (for example, about 1350° C.).

With reference to FIG. 3, after forming the gate oxide film, thickness t1 of the portion of gate oxide film 15 on contact point C1 between first main surface 10a of silicon carbide substrate 10 and side surface SW of trench TR is larger than thickness t3 of the portion of gate oxide film 15 on base region 13. Thickness t1 of the portion of gate oxide film 15 on contact point C1 between first main surface 10a of silicon carbide substrate 10 and side surface SW of trench TR refers to the thickness of gate oxide film 15 in the direction perpendicular to first main surface 10a. Moreover, thickness t3 of the portion of gate oxide film 15 on base region 13 refers to the thickness of the portion of gate oxide film 15 in the direction perpendicular to the portion of second side surface portion SW2 constituted of base region 13. Preferably, thickness t4 of the portion of gate oxide film 15 on bottom portion BT of trench TR is larger than thickness t3 of the portion of gate oxide film 15 on base region 13. Thickness t4 of the portion of gate oxide film 15 on bottom portion BT of trench TR refers to thickness t4 of the portion of gate oxide film 15 in the direction perpendicular to bottom portion BT of trench TR. Preferably, thickness t2 of the portion of gate oxide film 15 on source region 14 is smaller than the thickness of the portion of gate oxide film 15 on contact point C1 between first main surface 10a and first side surface portion SW1, and is larger than thickness t3 of the portion of gate oxide film 15 on base region 13. The thickness of the portion of gate oxide film 15 on source region 14 refers to thickness t2 of the portion of gate oxide film 15 in the direction perpendicular to first side surface portion SW1.

After the formation of the gate oxide film, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced in an interface region between gate oxide film 15 and base region 13. As a result, formation of interface states in the interface region is suppressed, thereby achieving improved channel mobility. It should be noted that a gas other than the NO gas can be employed as the atmospheric gas as long as the nitrogen atoms can be thus introduced. After the NO annealing, Ar annealing may be further performed using argon (Ar) as an atmospheric gas. The Ar annealing is preferably performed at a heating temperature higher than the heating temperature in the above-described NO annealing and lower than the melting point of gate oxide film 15. This heating temperature is held for approximately 1 hour, for example. Accordingly, formation of interface states in the interface region between gate oxide film 15 and base region 13 is further suppressed. It should be noted that instead of the Ar gas, an inert gas such as nitrogen gas can be employed as the atmospheric gas.

Preferably, after the step of forming gate oxide film 15, contact point C2 between first side surface portion SW1 and second side surface portion SW2 is located in source region 14. In other words, contact point C2 between first side surface portion SW1 and second side surface portion SW2 is located between base region 13 and first main surface 10a. First angle θ1 formed by first side surface portion SW1 and the straight line extending through contact point C2 between first side surface portion SW1 and second side surface portion SW2 and parallel to first main surface 10a of silicon carbide substrate 10 is smaller than second angle θ2 formed by second side surface portion SW2 and boundary surface 13a between drift region 12 and base region 13. Preferably, second angle θ2 formed by second side surface portion SW2 and boundary surface 13a between drift region 12 and base region 13 is not less than 50° and not more than 65°. Preferably, first angle θ1 formed by first side surface portion SW1 and the straight line extending through contact point C2 between first side surface portion SW1 and second side surface portion SW2 and parallel to first main surface 10a of silicon carbide substrate 10 is not less than 20° and less than 50°.

Figure 13:
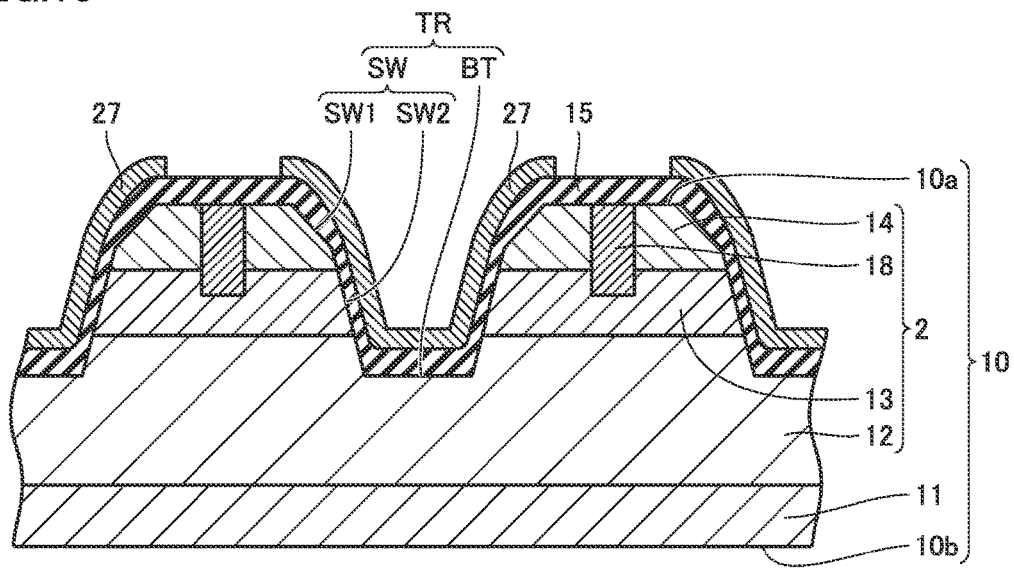
FIG. 13 is a partial cross sectional view schematically showing an eighth step of the method for manufacturing the silicon carbide semiconductor device in the one embodiment of the present invention.

Next, a gate electrode forming step (S40: FIG. 5) is performed. With reference to FIG. 13, gate electrode 27 is formed on gate oxide film 15. For example, gate electrode 27 is formed by forming a film of a conductor or polysilicon doped with an impurity on gate oxide film 15. Next, interlayer insulating film 21 is formed on gate electrode 27 and gate oxide film 15 so as to cover the exposed surface of gate electrode 27. Interlayer insulating film 21 is formed to fill trench TR. Next, etching is performed to form an opening in interlayer insulating film 21 and gate oxide film 15. Through the opening, source region 14 and contact region 18 are exposed from gate oxide film 15 and interlayer insulating film 21 on first main surface 10a of silicon carbide substrate 10.

Figure 14:
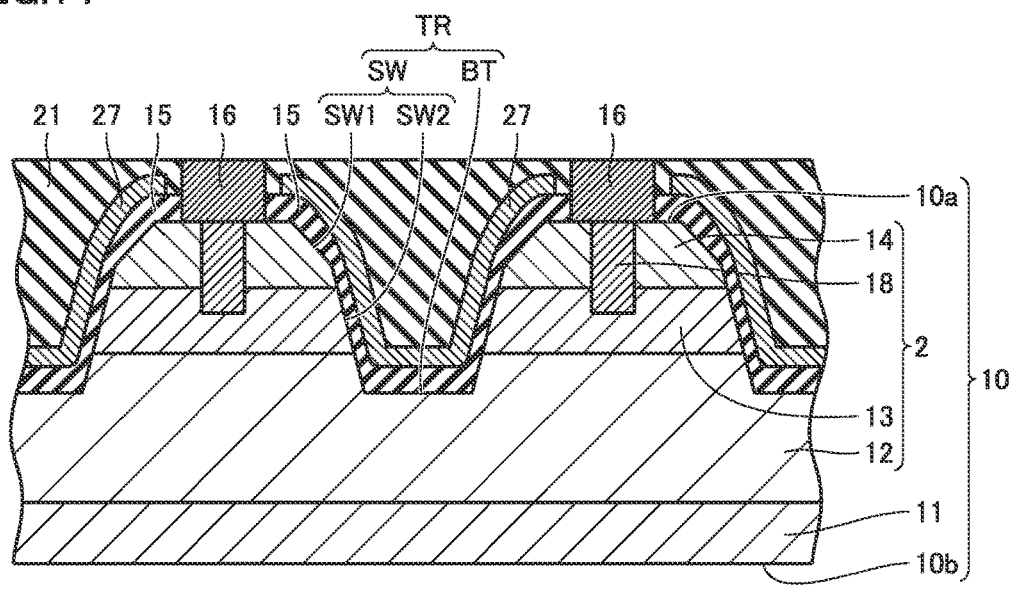
FIG. 14 is a partial cross sectional view schematically showing a ninth step of the method for manufacturing the silicon carbide semiconductor device in the one embodiment of the present invention.

Next, a source electrode forming step (S50: FIG. 5) is performed. With reference to FIG. 14, source electrode 16 is formed in contact with source region 14 and contact region 18. Source electrode 16 is composed of a material including TiAlSi, for example. Next, silicon carbide substrate 10 including source electrode 16 formed thereon is heated at, for example, about 1000° C., whereby source electrode 16 is in ohmic junction with source region 14 of silicon carbide substrate 10. Next, source interconnection layer 19 is formed in contact with source electrode 16. Source interconnection layer 19 is composed of a material including aluminum, for example. Next, drain electrode 20 composed of, for example, a material including NiSi is formed on second main surface 10b of silicon carbide single crystal substrate 11. In this way, manufacturing of MOSFET 1 shown in FIG. 1 is completed.

(Special Plane)

The following fully describes the "special plane" described above. As described above, side surface SW (see FIG. 3) preferably has the special plane particularly on base region 13. The following describes a case where side surface SW has the special plane.

Figure 15:
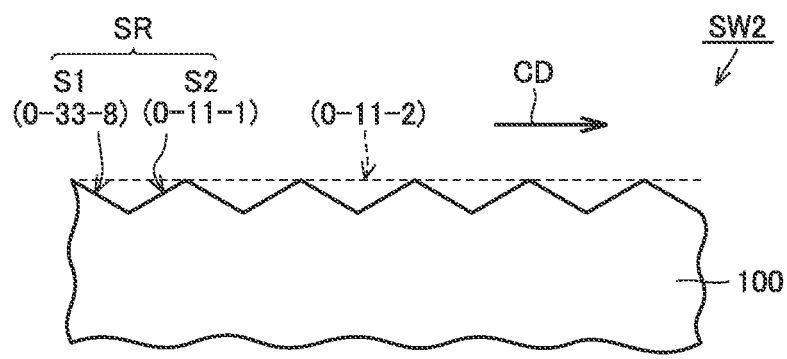
FIG. 15 is a partial cross sectional view schematically showing a fine structure of the side surface of the trench provided in the silicon carbide semiconductor device of FIG. 1.

As shown in FIG. 15, side surface SW having the special plane has a plane S1 (first plane). Plane S1 has a plane orientation of {0-33-8}, and preferably has a plane orientation of (0-33-8). Preferably, side surface SW microscopically includes plane S1. Preferably, side surface SW further microscopically includes a plane S2 (second plane). Plane S2 has a plane orientation of {0-11-1}, and preferably has a plane orientation of (0-11-1). Here, the term "microscopically" refers to "minutely to such an extent that at least the size about twice as large as an interatomic spacing is considered". As a method for observing such a microscopic structure, for example, a TEM (Transmission Electron Microscope) can be used.

Preferably, side surface SW has a combined plane SR. Combined plane SR is constituted of periodically repeated planes S1 and S2. Such a periodic structure can be observed by, for example, TEM or AFM (Atomic Force Microscopy). Combined plane SR has a plane orientation of {0-11-2}, and preferably has a plane orientation of (0-11-2). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, in the channel surface, carriers flow in a channel direction CD, in which the above-described periodic repetition is done.

Next, the detailed structure of combined plane SR will be illustrated.

Figure 16:
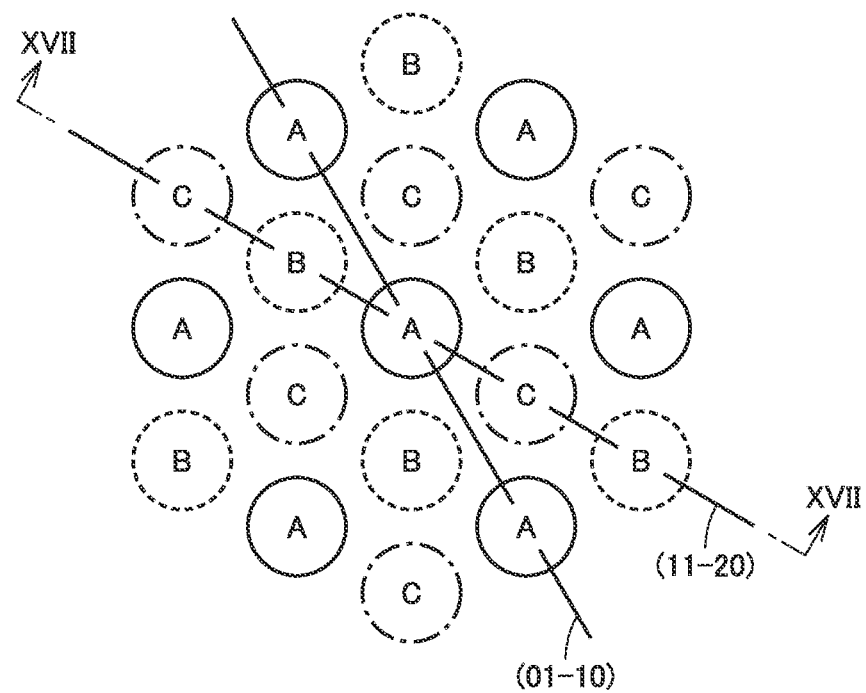
FIG. 16 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 16. In other words, with four layers ABCB being regarded as one period, a periodic stacking structure such as ABCBABCBABCB . . . is provided.

Figure 17:
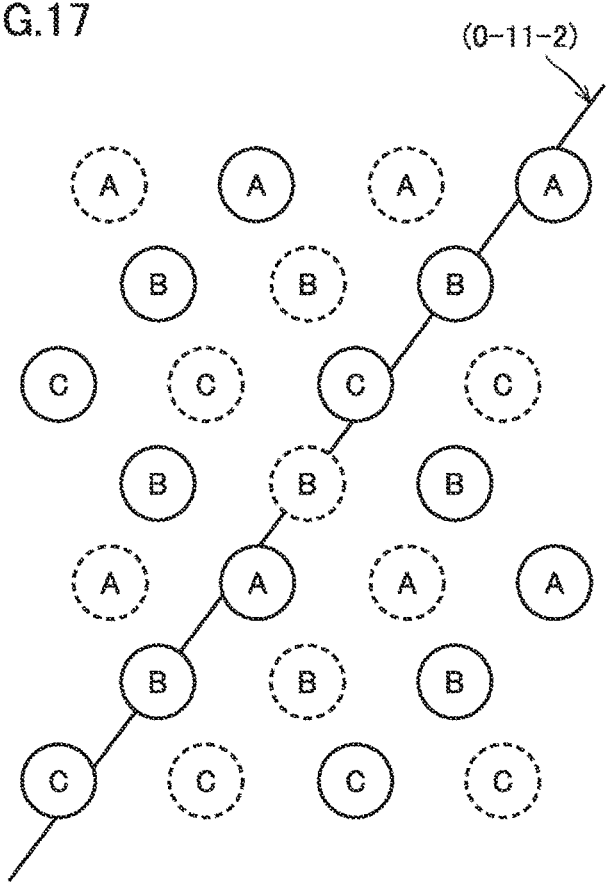
FIG. 17 shows a crystal structure of a (11-20) plane along a line XVII-XVII of FIG. 16.

As shown in FIG. 17, in the (11-20) plane (cross section taken along a line XVII-XVII of FIG. 16), atoms in each of four layers ABCB constituting the above-described one period are not aligned completely along the (0-11-2) plane. In FIG. 17, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 18:
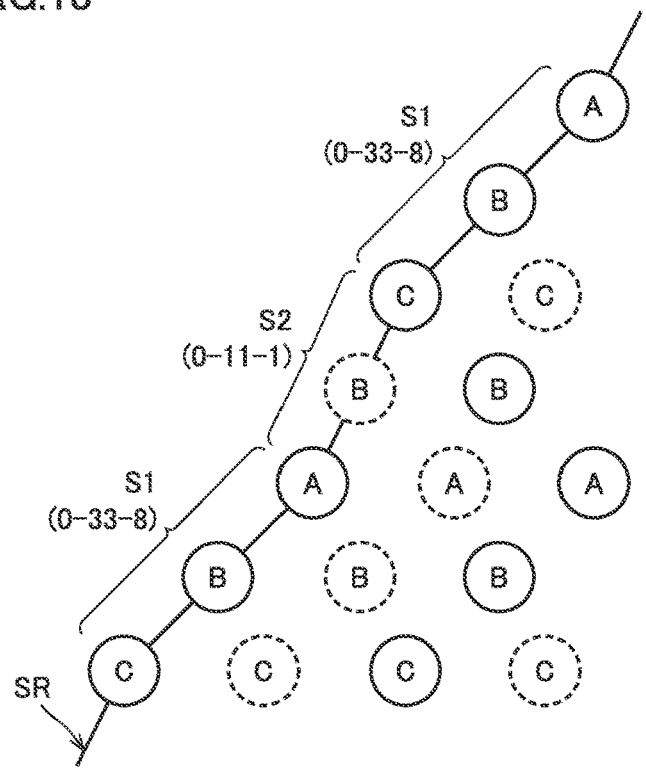
FIG. 18 shows a crystal structure in the vicinity of a surface with a combined plane of FIG. 15 within a (11-20) plane.

As shown in FIG. 18, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 17).

Figure 19:
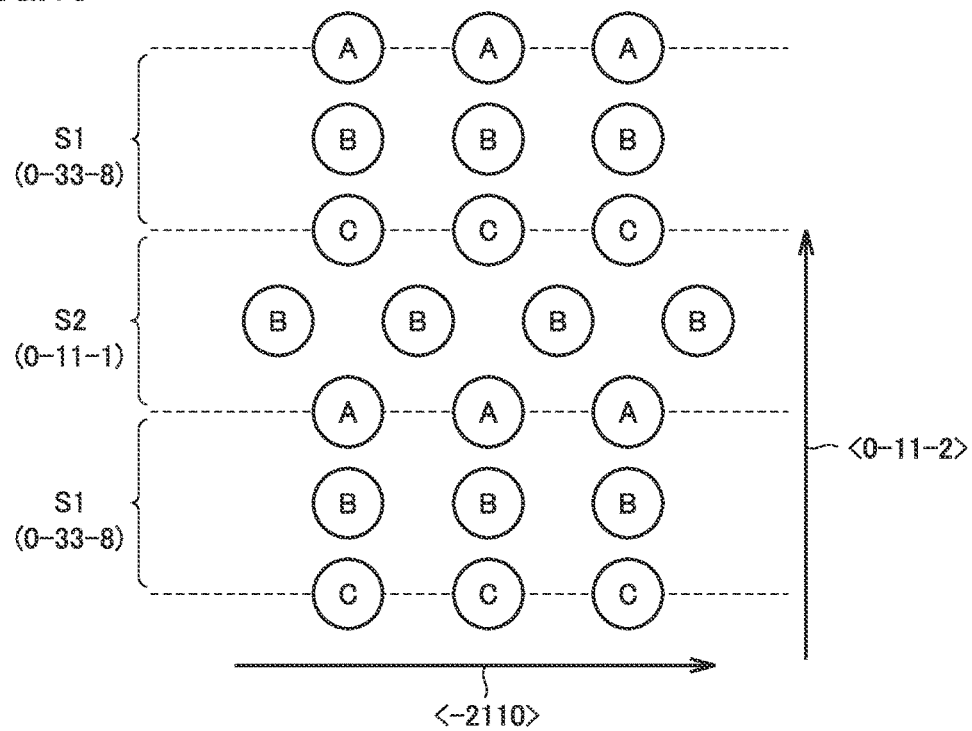
FIG. 19 shows the combined plane of FIG. 15 when viewed from a (01-10) plane.

As shown in FIG. 19, when viewing combined plane SR from the (01-10) plane, the single crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 19) having a plane orientation of (001) in the structure equivalent to the cubic structure and the planes (planes S2 in FIG. 19) connected to the foregoing planes and having a plane orientation different from that of each of the foregoing planes. The polytype may be 6H or 15R, for example.

Figure 20:
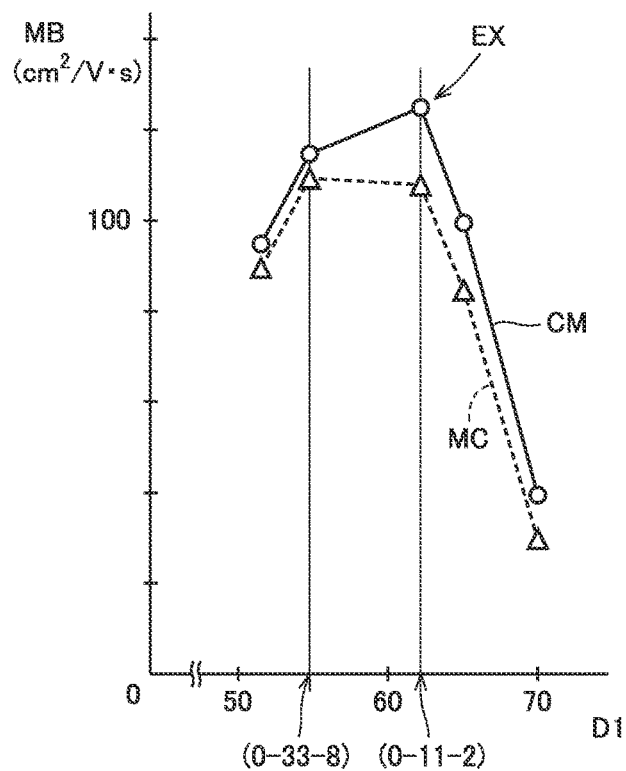
FIG. 20 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 20, the following describes a relation between the crystal plane of side surface SW and mobility MB of the channel surface. In the graph of FIG. 20, the horizontal axis represents an angle D1 formed by the (000-1) plane and the macroscopic plane orientation of side surface SW having the channel surface, whereas the vertical axis represents mobility MB. A group of plots CM correspond to a case where side surface SW is finished to correspond to a special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (an arrow EX). This is presumably due to the following reason. That is, as shown in FIG. 18 and FIG. 19, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 21:
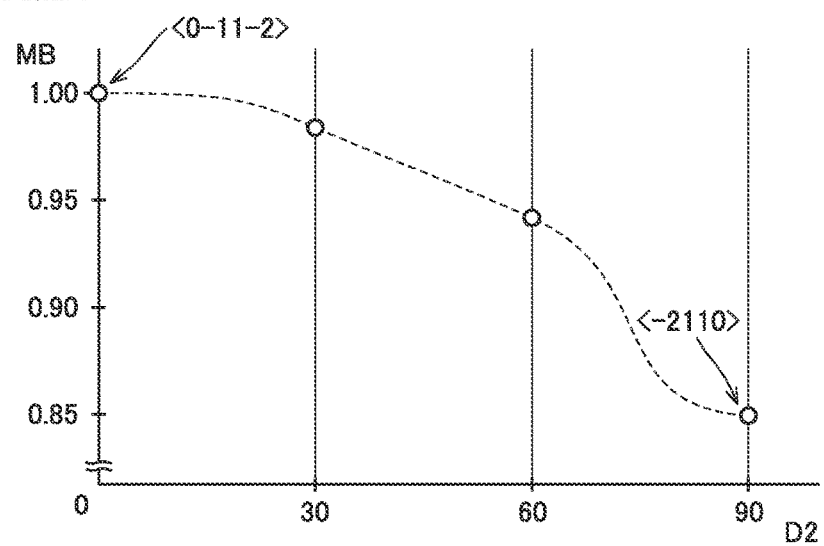
FIG. 21 is a graph showing an exemplary relation between the channel mobility and an angle between a channel direction and a <0-11-2> direction.

It should be noted that mobility MB has orientation dependency on combined plane SR. In a graph shown in FIG. 21, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 15) preferably has an angle D2 of not less than 0° and not more than 60°, more preferably, substantially 0°.

Figure 22:
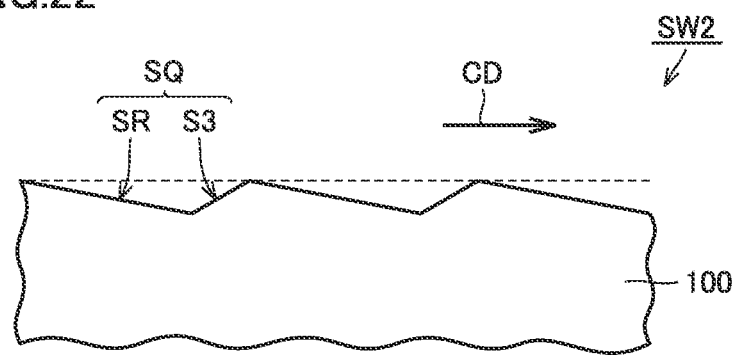
FIG. 22 shows a modification of FIG. 15.

As shown in FIG. 22, side surface SW may further include a plane S3 (third plane) in addition to combined plane SR (indicated in a simplified manner by a straight line in FIG. 22). In this case, the off angle of side surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

More specifically, side surface SW may include a combined plane SQ constituted of periodically repeated plane S3 and combined plane SR. Such a periodic structure can be observed by the TEM or the AFM, for example.

As described above, side surface SW of trench TR constituted of base region 13 (in other words, second side surface portion SW2) may include first plane S1 having a plane orientation of {0-33-8}. Preferably, second side surface portion SW2 microscopically includes first plane S1, and second side surface portion SW2 microscopically further includes second plane S2 having a plane orientation of {0-11-1}. Preferably, first plane S1 and second plane S2 of second side surface portion SW2 include a combined plane having a plane orientation of {0-11-2}. Preferably, second side surface portion SW2 macroscopically has an off angle of 62°±10° relative to the {000-1} plane.

Next, the following describes function and effect of the silicon carbide semiconductor device and the method for manufacturing the silicon carbide semiconductor device in accordance with the present embodiment.

According to MOSFET 1 in accordance with the present embodiment, the thickness of the portion of gate oxide film 15 on contact point C1 between main surface 10a and first side surface portion SW1 is larger than the thickness of the portion of gate oxide film 15 on base region 13. Hence, leakage current can be suppressed at the portion of gate oxide film 15 on contact point C1 between main surface 10a and side surface SW while maintaining a low resistance of the channel portion of base region 13. As a result, MOSFET 1 can be obtained which has high reliability and is capable of maintaining a low channel resistance.

Moreover, according to MOSFET 1 in accordance with the present embodiment, angle θ2 formed by second side surface portion SW2 and boundary surface 13a between drift region 12 and base region 13 is not less than 50° and not more than 65°. Accordingly, channel resistance in base region 13 can be effectively reduced.

Further, according to MOSFET 1 in accordance with the present embodiment, angle θ1 formed by first side surface portion SW1 and the straight line extending through contact point C2 between first side surface portion SW1 and second side surface portion SW2 and parallel to main surface 10a is not less than 20° and less than 50°. By setting angle θ1 at not less than 20°, the width of trench TR is increased, thereby suppressing the cell density from being decreased. By setting angle θ1 at less than 50°, the thickness of gate oxide film 15 on contact point C1 between main surface 10a and first side surface portion SW1 can be increased effectively.

Further, according to MOSFET 1 in accordance with the present embodiment, the thickness of the portion of gate oxide film 15 on bottom portion BT of trench TR is larger than the thickness of the portion of gate oxide film 15 on base region 13. Accordingly, occurrence of leakage current can be suppressed in gate oxide film 15 on bottom portion BT of trench TR.

Further, according to MOSFET 1 in accordance with the present embodiment, second side surface portion SW2 of trench TR includes a first plane S1 having a plane orientation of {0-33-8}. Accordingly, channel resistance in side surface SW can be reduced. Hence, on resistance of MOSFET 1 can be reduced.

Further, according to MOSFET 1 in accordance with the present embodiment, second side surface portion SW2 of trench TR microscopically includes first plane S1, and second side surface portion SW2 microscopically further includes a second plane S2 having a plane orientation of {0-11-1}. Accordingly, channel resistance in side surface SW can be further reduced. Hence, on resistance of MOSFET 1 can be reduced.

Further, according to MOSFET 1 in accordance with the present embodiment, first plane S1 and second plane S2 of second side surface portion SW2 of trench TR include a combined plane having a plane orientation of {0-11-2}. Accordingly, channel resistance in side surface SW can be further reduced. Hence, on resistance of MOSFET 1 can be reduced.

Further, according to MOSFET 1 in accordance with the present embodiment, second side surface portion SW2 of trench TR macroscopically has an off angle of 620±10° relative to a {000-1} plane. Accordingly, channel resistance in side surface SW can be further reduced. Hence, on resistance of MOSFET 1 can be reduced.

According to the method for manufacturing MOSFET 1 in accordance with the present embodiment, the thickness of the portion of gate oxide film 15 on contact point C1 between main surface 10a and first side surface portion SW1 is larger than the thickness of the portion of gate oxide film 15 on base region 13. Hence, leakage current can be suppressed at the portion of gate oxide film 15 on contact point C1 between main surface 10a and side surface SW while maintaining a low resistance of the channel portion of base region 13. As a result, MOSFET 1 can be obtained which has high reliability and is capable of maintaining a low channel resistance.

Moreover, according to the method for manufacturing MOSFET 1 in accordance with the present embodiment, the step of forming gate oxide film 15 includes a step of oxidizing silicon carbide substrate 10 at not more than 1300° C. Accordingly, plane orientation dependency of the oxidation rate of silicon carbide can be increased. Hence, the thickness of the portion of gate oxide film 15 on contact point C1 between main surface 10a and first side surface portion SW1 can be significantly larger than the thickness of the portion of gate oxide film 15 on side surface SW of trench TR (particularly base region 13). As a result, MOSFET 1 can be obtained which has higher reliability and is capable of maintaining a low channel resistance.

Further, according to the method for manufacturing MOSFET 1 in accordance with the present embodiment, the first gas includes at least one selected from a group consisting of chlorine and an interhalogen compound. Accordingly, silicon carbide can be etched effectively.

Further, according to the method for manufacturing MOSFET 1 in accordance with the present embodiment, the step of etching silicon carbide substrate 10 includes: a first step of etching the silicon carbide substrate using the first gas and a second gas including at least one of oxygen, fluorine, and hydrogen; and a second step of etching silicon carbide substrate 10 using the first gas and the second gas after decreasing a flow rate of the second gas as compared with a flow rate of the second gas in the first step. Accordingly, the shape of trench TR can be controlled with high precision.

Further, according to the method for manufacturing MOSFET 1 in accordance with the present embodiment, in the second step, silicon carbide substrate 10 is etched using the first gas after stopping introduction of the second gas. Accordingly, the shape of trench TR can be controlled with higher precision.

Further, according to the method for manufacturing MOSFET 1 in accordance with the present embodiment, the second gas includes at least one selected from a group consisting of oxygen, fluorine, hydrogen, sulfur hexafluoride, carbon tetrafluoride, hydrogen chloride, chlorine monoxide, chlorine dioxide, dichlorine monoxide and dichlorine heptoxide. Accordingly, silicon carbide can be etched more effectively.

Further, according to the method for manufacturing MOSFET 1 in accordance with the present embodiment, the step of forming trench TR includes a step of etching silicon carbide substrate 10 at not less than 700° C. and not more than 1000° C. By etching silicon carbide substrate 10 at not less than 700° C., silicon carbide can be etched effectively. By etching silicon carbide substrate 10 at not more than 1000° C., the etching rate of silicon carbide can be suppressed from being too high, thereby controlling the shape of trench TR with high precision.

Further, according to the method for manufacturing MOSFET 1 in accordance with the present embodiment, after the step of forming gate oxide film 15, angle θ2 formed by second side surface portion SW2 and boundary surface 13a between drift region 12 and base region 13 is not less than 50° and not more than 65°. Accordingly, channel resistance in base region 13 can be effectively reduced.

Further, according to the method for manufacturing MOSFET 1 in accordance with the present embodiment, after the step of forming gate oxide film 15, angle θ1 formed by first side surface portion SW1 and the straight line extending through contact point C2 between first side surface portion SW1 and second side surface portion SW2 and parallel to main surface 10a is not less than 20° and less than 50°. By setting angle θ1 at not less than 20°, the width of trench TR is increased, thereby suppressing the cell density from being decreased. By setting angle θ1 at less than 50°, the thickness of gate oxide film 15 on contact point C1 between main surface 10a and first side surface portion SW1 can be increased effectively.

Further, according to the method for manufacturing MOSFET 1 in accordance with the present embodiment, after the step of forming gate oxide film 15, a thickness of a portion of gate oxide film 15 on bottom portion BT of trench TR is larger than a thickness of a portion of gate oxide film 15 on second impurity region 13. Accordingly, leakage current can be suppressed from being generated in gate oxide film 15 on bottom portion BT of trench TR.

In the above-described embodiment, it has been illustrated that the first conductivity type corresponds to n type conductivity and the second conductivity type corresponds to p type conductivity; however, the first conductivity type may correspond to p type conductivity and the second conductivity type may correspond to n type conductivity. Although the MOSFET has been illustrated as the example of the silicon carbide semiconductor device, the silicon carbide semiconductor device may be an IGBT (Insulated Gate Bipolar Transistor) or the like.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide semiconductor device (MOSFET); 2: silicon carbide epitaxial layer; 10: silicon carbide substrate; 10a: first main surface; 10b: second main surface; 11: single crystal substrate; 12: drift region (first impurity region); 13: base region (second impurity region); 13a: boundary surface; 14: source region (third impurity region); 15: gate oxide film; 16: source electrode; 18: contact region; 19: source interconnection layer; 20: drain electrode; 21: interlayer insulating film; 27: gate electrode; 40: etching mask; BT: bottom portion; C1, C2: contact point; CD: channel direction; D1, D2: angle; EX: arrow; MC: group of plots; S1: first plane; S2: second plane; SQ, SR: combined plane; SW: side surface; SW1: first side surface portion; SW2: second side surface portion; TQ: recess; TR: trench.

The invention claimed is:

1. A silicon carbide semiconductor device comprising:
a silicon carbide substrate having a main surface, the silicon carbide substrate including a first impurity region, a second impurity region, and a third impurity region, the first impurity region having first conductivity type, the second impurity region being provided on the first impurity region, the second impurity region having second conductivity type different from the first conductivity type, the third impurity region being provided on the second impurity region, the third impurity region having the first conductivity type, the third impurity region constituting at least a portion of the main surface, a trench being provided in the main surface to have a side surface and a bottom portion, the side surface extending to the first impurity region through the third impurity region and the second impurity region, the bottom portion being located in the first impurity region, the side surface including a first side surface portion and a second side surface portion, the first side surface portion being continuous to the main surface, the second side surface portion connecting the first side surface portion to the bottom portion, a contact point between the first side surface portion and the second side surface portion being located in the third impurity region, an angle formed by the first side surface portion and a straight line extending through the contact point between the first side surface portion and the second side surface portion and parallel to the main surface being smaller than an angle formed by the second side surface portion and a boundary surface between the first impurity region and the second impurity region;
a gate oxide film in contact with the third impurity region at the first side surface portion of the trench, in contact with the third impurity region and the second impurity region at the second side surface portion of the trench, and in contact with the first impurity region at the bottom portion of the trench; and
a gate electrode provided on the gate oxide film,
a thickness of a portion of the gate oxide film on a contact point between the main surface and the first side surface portion being larger than a thickness of a portion of the gate oxide film on the second impurity region,
wherein the first side surface portion is a first linear side surface portion, and the second side surface portion is a second linear side surface portion, and
wherein the width of the trench is increased from the bottom portion of the trench to the main surface in a tapered manner.

2. The silicon carbide semiconductor device according to claim 1, wherein the angle formed by the second side surface portion and the boundary surface between the first impurity region and the second impurity region is not less than 50° and not more than 65°.

3. The silicon carbide semiconductor device according to claim 1, wherein the angle formed by the first side surface portion and the straight line extending through the contact point between the first side surface portion and the second side surface portion and parallel to the main surface is not less than 20° and less than 50°.

4. The silicon carbide semiconductor device according to claim 1, wherein a thickness of the portion of the gate oxide film on the bottom portion of the trench is larger than the thickness of the portion of the gate oxide film on the second impurity region.

5. The silicon carbide semiconductor device according to claim 1, wherein the second side surface portion of the trench includes a first plane having a plane orientation of {0-33-8}.

6. The silicon carbide semiconductor device according to claim 5, wherein the second side surface portion of the trench microscopically includes the first plane, and the second side surface portion microscopically further includes a second plane having a plane orientation of {0-11-1}.

* * * * *